United States Patent [19]
Okazawa et al.

[11] Patent Number: 5,381,544
[45] Date of Patent: Jan. 10, 1995

[54] COPYBACK MEMORY SYSTEM AND CACHE MEMORY CONTROLLER WHICH PERMITS ACCESS WHILE ERROR RECOVERY OPERATIONS ARE PERFORMED

[75] Inventors: Koichi Okazawa, Tokyo; Kazushi Kobayashi, Ebina; Ichiharu Aburano, Hitachi, all of Japan

[73] Assignee: Hitachi, Ltd., Tokyo, Japan

[21] Appl. No.: 822,110

[22] Filed: Jan. 17, 1992

[30] Foreign Application Priority Data

Jan. 22, 1991 [JP] Japan .................. 3-005958

[51] Int. Cl.[6] .................. G11C 29/00; G06F 11/00
[52] U.S. Cl. .................. 395/575; 364/243.41; 364/DIG. 1; 395/425
[58] Field of Search .............. 371/40.1; 395/575, 425; 364/243.41, 243.4

[56] References Cited

U.S. PATENT DOCUMENTS 5,274,799 12/1993 Brant et al. .................. 395/575

FOREIGN PATENT DOCUMENTS 241537 2/1990 Japan .
266652 3/1990 Japan .

OTHER PUBLICATIONS

Computer, "A Survey of Cache Coherence Schemes for Multiprocessors", by Per Stenstrom, Jun. 1990, IEEE.
Computer, "A Case for Direct-Mapped Cache", Mark D. Hill, Dec. 1988, IEEE.

Primary Examiner—Charles E. Atkinson
Attorney, Agent, or Firm—Antonelli, Terry, Stout & Kraus

[57] ABSTRACT

A cache memory system for controlling a cache memory. The cache memory system is connected to a central processing unit and a main memory and the cache memory system is controlled to operate in a copyback operation mode. The cache memory system includes the cache memory which operates as cache memory to the central processing unit and a control circuit, responsive to detection of an error in the cache memory, for suspending an updating operation of an entry in the cache memory in which the error was detected, controlling access to valid entries in the cache memory, and causing the cache memory to operate as cache memory only when access from the central processing unit hits the valid entries of the cache memory.

18 Claims, 6 Drawing Sheets

COPYBACK MEMORY SYSTEM AND CACHE MEMORY CONTROLLER WHICH PERMITS ACCESS WHILE ERROR RECOVERY OPERATIONS ARE PERFORMED

The present invention relates to cache memory systems for use in information processors such as personal computers, workstations and office computers. More particularly, the present invention relates to a cache memory system controlled to operate in a copyback operation mode wherein recovery processing, occurring as a result of an error in the contents of the cache memory, is performed such that only valid entries in the cache memory are accessed and copyback operation is inhibited until the error is corrected.

Various operation modes have been proposed for controlling the operation of cache memory included in an information processor. Two known types of operation modes for controlling operation of cache memory are the write through operation mode and the copyback or writeback operation mode. The write through operation mode operates by permitting the central processing unit to always gain access to both the cache memory and the main memory. In the write through operation mode the contents stored in the main memory always agree with the contents stored in the cache memory being that the main memory is updated each time the central processing unit writes into the cache memory. The copyback or writeback operation mode operates by permitting the central processing unit to only gain access to the cache memory. Thus, when the information to be accessed does not exist in the cache memory the information is obtained from the main memory and stored in the cache memory. In the copyback or writeback operation mode apparatus is provided for automatically copying the contents stored in the cache memory into the main memory so as to bring the contempts of the main memory into agreement with the contents of the cache memory as needed. The write through and copyback or writeback operation modes are used to ensure the integrity of data between the main memory and the cache memory.

Other such operation modes for controlling the operation of a cache memory included in an information processor so as to ensure the consistency in data between the cache memory and the main memory are disclosed by "A Survey of Cache Coherence Schemes for Multiprocessors", p. Stenstrom, *Computer,* June 1991, pp. 12–24 and "A Case for Direct-Mapped Caches", M. D. Hill, *Computer,* December 1988, pp. 25–40.

In Japanese Laid-Open Patent Publication No. 2-41537 a method is disclosed for controlling cache memory operated in the write through operation mode to perform error recovery in the event of an error detected in the contents of the cache memory. In this method when an error in the contents of the cache memory is detected the main memory is accessed with the address at which the error has occurred and the contents stored in the main memory are copied into the cache memory to correct the error. Thereafter operation is resumed.

Japanese Laid-Open Publication No. 2-66652 discloses a method for controlling cache memory in which additional bits corresponding to addresses in the address array are provided and when an error is detected in the main memory, the cache memory is used as a substitute memory for the main memory by use of the additional bits so as to thereby continue the process being currently executed. This method may also be applicable to where an error is detected in the cache memory itself.

Other methods and apparatuses for responding to errors or faults detected in the cache memory are disclosed by Japanese Laid-Open Patent Publication Nos. 55-122287, 57-133596, 63-66647 and 1-298453.

With recent advancements in the performance of central processing units it is of great desire to reduce as much as possible the number of times a central processing unit accesses the main memory. Each access to the main memory by the central processing unit includes an inordinate amount of waiting time being that the memory devices typically used in main memory are of the low speed type. The waiting time reduces the processing speed of the central processing unit. Thus it is considered more advantageous to use the copyback or writeback operation mode in which the number of times of access to the main memory is held to a minimum. However, the control of operations of a cache memory operating in the copyback or writeback operation mode is very complex.

In the conventional system disclosed by Japanese Laid-Open Patent Publication No. 2-41537 an error occurs when the contents of the cache memory does not agree with the contents of the main memory. To correct the error the contents of the main memory are copied into the cache memory thus causing the contents stored in the main memory to always agree with the contents stored in the cache memory. Since the conventional system taught by Japanese Laid-Open Patent Publication No. 2-41537 is a system operated in the write through operation mode the operation taught therein cannot be applied to a cache memory operated in the copyback or writeback operation mode. This is due to the fact that when a cache memory is operating in the copyback or writeback operation mode, there are cases where the contents stored in the main memory do not agree with the contents stored in the cache memory and such lack of agreement is not an error. Further, the system taught by Japanese Laid-Open Patent Publication No. 2-41537 is operated in the write through operation mode which tends to be slower than a system operated in the copyback operation mode since the main memory is accessed more times.

Similarly, since the conventional system disclosed by Japanese Laid-Open Publication No. 2-66652 is a cache memory operated in the write through operation mode, it too suffers from the same deficiency as the system disclosed in Japanese Laid-Open Patent Publication No. 2-41537.

SUMMARY OF THE INVENTION

An object of the present invention is to provide a cache memory system and a cache memory controller which are controlled to operate in a copyback operation mode, and in which the recovery processing in the event of an error detected in the contents of the cache memory can be easily performed.

In order to achieve the above described object of the present invention the cache memory system according to the present invention is connected to a central processing unit and a main memory. The cache memory system is controlled to operate in the copyback or writeback operation mode. As is known, in a copyback operation the contents of the cache memory are copied as necessary into the main memory to bring the contents of the main memory into agreement with the cache memory when an entry of the cache memory is being updated.

The cache memory system of the present invention includes a cache memory for operating as cache memory to the central processing-unit and a control circuit, responsive to detection of an error in an entry of cache memory, for suspending an updating operation of the entry in the cache memory, controlling access to valid entries of the cache memory and causing the cache memory to operate as cache memory only when access from the central processing unit hits the valid entries of the cache memory.

The present invention as described above includes an error detection circuit for detecting an error when the cache memory is accessed. The control circuit, in response to detection of an error in an entry in the cache memory by the error detection circuit, suspends an updating operation of the entry widen the error is detected, controls valid entries of the cache memory existing when the error is detected and causes the cache memory to operate as cache memory only when access from the central processing unit hits the valid entries of the cache memory.

The cache memory system of the present invention further includes apparatus for resuming the suspended updating operation in response to instructions from the central processing unit. The resuming operation is performed after correction of the error in the cache memory.

The control circuit as described above may be operated in a manner such that the control circuit, after an error of the cache memory is detected when the cache memory is accessed, allows access from the central processing unit to a valid entry of the cache memory existing at the time the error is detected, allows access from the central processing unit to the cache memory when the access hits an entry in the cache memory, inhibits access from the central processing unit to the cache memory when the access miss-hits an entry in the cache memory and allows the central processing unit to have the main memory accessed without replacing the contents of the cache memory when the access miss-hits an entry in the cache memory.

The cache memory controller of the present invention controls, under control of a central processing unit, a cache memory for storing a copy of a portion of the contents of a main memory and a tag memory for storing address information of the copy stored in the cache memory. The cache memory controller of the present invention includes a tag memory control circuit for controlling read and write operations of the tag memory, a cache memory control circuit for controlling read and write operations of the cache memory, an error detection circuit for detecting an error in the cache memory, an error retaining circuit for retaining, when an error is detected by the error detection circuit, error information indicating that an error has been detected, and a sequence control circuit for controlling, under control of the central processing unit, operations of the tag memory control circuit and the cache memory control circuit according to the error information retained in the error retaining circuit.

Preferably, the sequence control circuit inhibits write operations of new address information into the tag memory when error information indicating detection of an error is retained in the error retaining circuit and allows read and write operations of the cache memory when access from the central processing unit for data in the cache memory hits address information stored in the tag memory corresponding to valid data in the cache memory.

The cache memory controller as described above further includes apparatus for allowing the central processing unit to alter the error information retained in the error retaining circuit.

When an error is detected in the contents of a cache memory controlled to operate in the copyback operation mode, the contents stored in the main memory in some cases are not in agreement with the contents stored in the cache memory. Accordingly, the central processing unit is required to suspend the updating operation of an entry of the cache memory in which the error is detected, to confirm whether the error is recoverable and thereupon to perform an error recovery process. In order to make this operation easier the present invention controls the performance of operations such that when an error is detected in an entry in the cache memory, updating operation of the entry is suspended. Thereafter with respect to valid entries existing when the error is detected, the cache memory will operate as cache memory only when access from the central processing unit hits one of the valid entries. Further, the present invention controls operations such that the suspended updating operation is resumed under instructions of the central processing unit after the error in the cache memory is corrected.

Thus, by use of the present invention, the central processing unit can perform the error recovery process after confirming whether the error is recoverable without regard as to whether the contents stored in the main memory are in agreement with the contents stored in the cache memory. Further, by use of the present invention the suspension of the updating operation of an entry in the cache memory in which the error is detected can be resumed under the instruction of the central processing unit, thereby returning the system to normal operation after the error recovery process has been completed.

BRIEF DESCRIPTION OF THE DRAWINGS

The features of the present invention which are believed to be novel are set forth with particularity in the appended claims. The present invention may be best understood, however, by reference a to the following descriptions in conjunction with the accompanying drawings in which:

DESCRIPTION OF THE PREFERRED EMBODIMENT

An embodiment of the present invention will now be described by referring to FIGS. 1 and 2.

Figure 1:
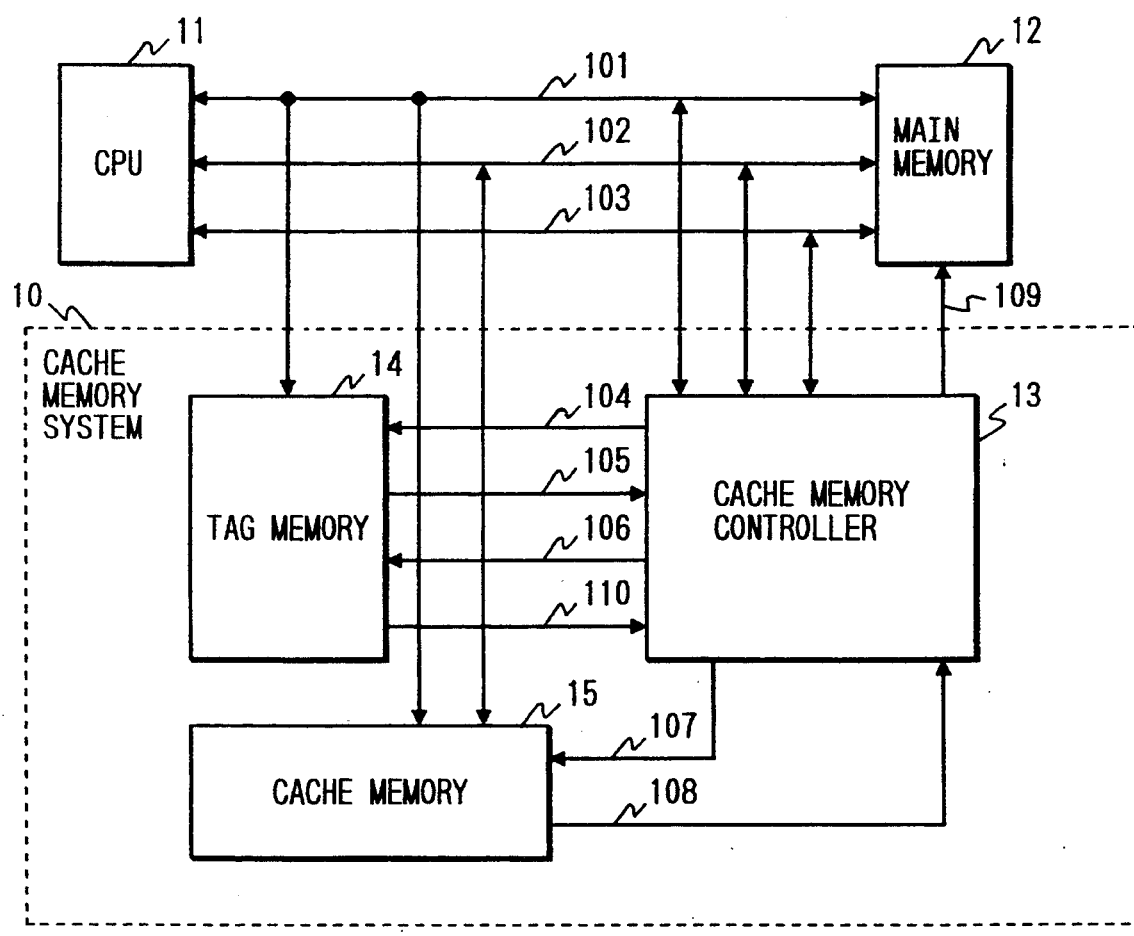
FIG. 1 is a block diagram of an embodiment of the present invention.

FIG. 1 is a block diagram of an embodiment of the present invention. In FIG. 1 the present invention provides a cache memory system 1D connected to a central processing unit (CPU) 11 and a main memory 12. The CPU 11 is connected by signal lines 101-103 to the main memory 12. Signal lines 101-103 constitute an external bus of CPU 11. The cache memory system 10, being connected to signal lines 101-103, includes a cache memory controller 13 formed of a single or a plurality of integrated circuits for controlling the cache memory system 10, a ready made or custom made tag memory; 14 having the function of a comparator and a ready made or custom made cache memory 15 which serves as the cache memory to the CPU 11. The cache memory 15 further provides a function of generating error detection data such as a parity bit and an error check function. Cache memory controller 13 is connected to tag memory 14 by signal lines 104-106 and 110 and to the cache memory 15 by signal lines 107-108. The cache memory controller 13 is also connected to signal lines 101-103 and to main memory 12 by signal line 109. Cache memory 15 is connected to signal lines 101 and 102 and tag memory 14 is connected to signal line 101.

Signal line 101 is an address line of the CPU 11, signal line 102 is a data line of the CPU 11, signal line 103 is a control line of the CPU 11, signal line 104 is a control line of the tag memory 14, signal line 105 is a comparison status line of the tag memory 14, signal line 106 is a data line of the tag memory 14, signal line 107 is a control line of the cache memory 15, signal line 108 is an error status line of the cache memory 15, signal line 109 is a start control line of the main memory 12 and signal line 110 is an error status line of the tag memory 14.

The term "cache memory" herein, in a narrow sense means the cache memory 15 but in a broad sense it also includes the tag memory 14.

The cache memory controller 13 as shown in FIG. 1 monitors the address line 101 and the control line 103 of the external bus of the CPU 11. When the CPU 11 requests a memory access, the cache memory controller 13 gains access to the tag memory 14 and the cache memory 15 and makes start control of the main memory 12, etc., to thereby control the cache memory system according to the copyback operation mode. Further, when the cache memory controller 13 detects a memory error while accessing the cache memory 15, the cache memory controller 13 suspends an updating operation of an entry in the cache memory 15 in which the error is detected, controls access to valid entries of the cache memory 15 and causes the cache memory 15 to operate as cache memory only when access from the CPU 11 hits valid entries of the cache memory 15.

Figure 2:
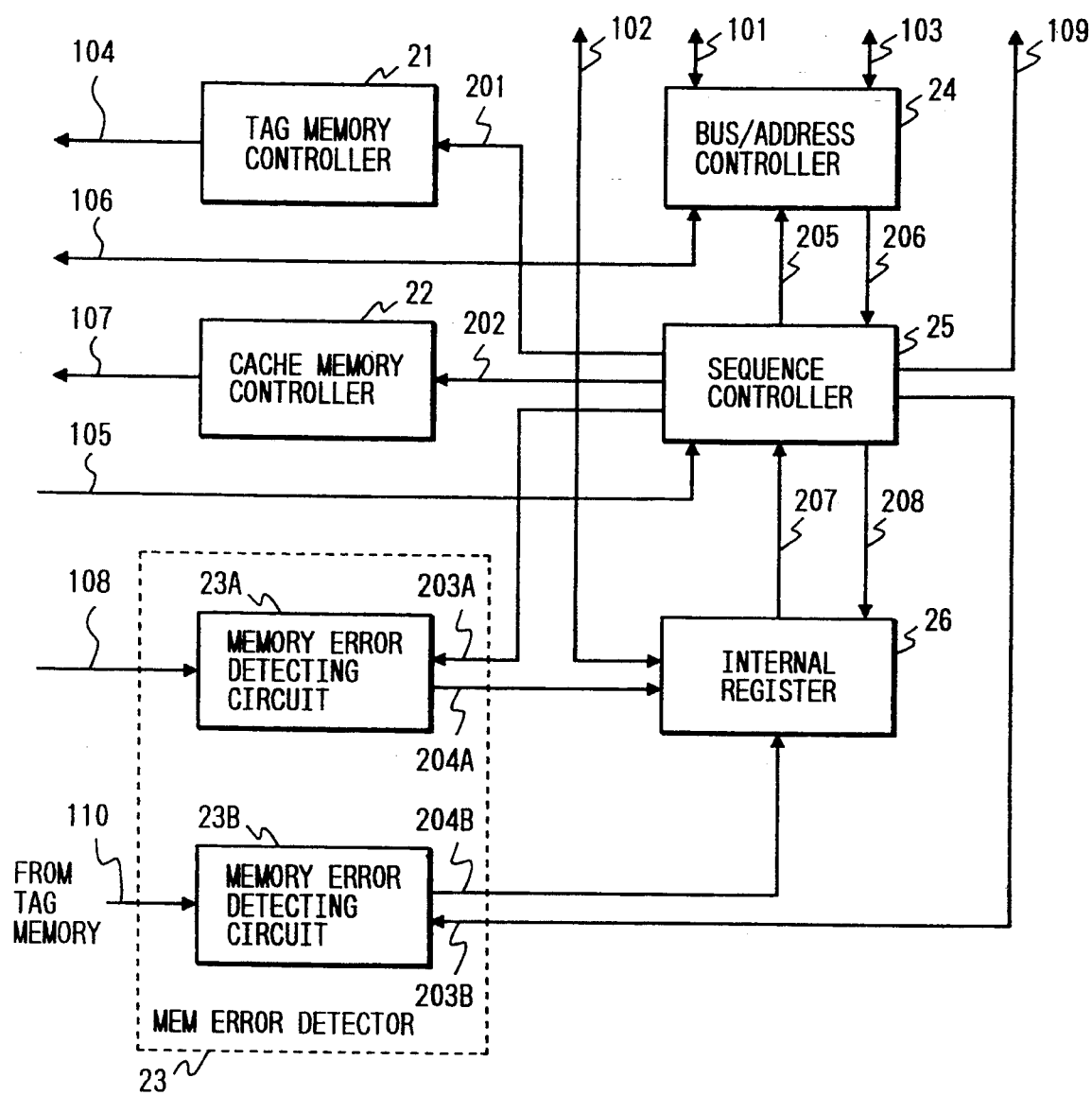
FIG. 2 is a block diagram of the internal structure of the cache memory controller shown in FIG. 1.

A block diagram of the internal structure of the cache memory controller 13 is shown in FIG. 2 and a flow chart of the processing steps performed by the cache memory controller 13 is shown in FIG. 31

Referring to FIG. 2 the cache memory controller 13 includes a tag memory control circuit 21, a cache memory control circuit 22, memory error detecting circuits 23A and 23B, a bus/address control circuit 24, a sequence control circuit 25 and an internal register 26.

The tag memory control circuit 21 is a general memory control logical circuit which controls the control line 104 connected to the tag memory 14 in response to an instructing signal 201 from the sequence control circuit 25. Thereby, access to the tag memory 14 is gained. The cache memory control circuit 22 is also a general memory control logic circuit which controls the control line 107 connected to the cache memory 15 in response to an instructing signal 202 from the sequence control circuit 25. Thereby, access to the cache memory 15 is gained.

The memory error detecting circuit 23A is a logical circuit which monitors the error status line 108 of the cache memory 15 in response to an instructing signal 203A from the sequence controlling circuit to thereby detect a memory error in the cache memory 15 and, in the event of a memory error, sets up an error mode in the internal register 26 through a signal line 204A. The memory error detecting circuit 23B is a logical circuit which monitors the error status line 110 of the tag memory 14 in response to an instructing signal 203B from the sequence controlling circuit 25 to thereby detect a memory error in the tag memory and, in the event of a memory error, sets up an error mode in the internal register 26 through a signal line 204B.

The internal register 26 permits an error mode to be set up therein by the signal lines 204A and 204B and is accessible by the CPU 11 through the data line 102 of the external bus of the CPU 11 in response to an instructing signal 208 from the sequence control circuit 25. This allows the CPU 11 to alter the contents of the internal register 26. Further, the internal register 26 is accessible by the sequence control circuit 25 through a signal line 207 to determine whether an error mode is set up.

In the present invention a memory error may occur in either the cache memory 15 or the tag memory 14. Such an error could be either a parity error or an illegal data error such as a tag entry in the tag memory in which a valid bit "V" is a logical value 0 and a dirty bit "D" is a logical value 1.

The bus/address control circuit 24 is a bus interface logic circuit for monitoring and controlling the address line 101 and the control line 103 of the external bus of the CPU 11. The bus/Address control circuit 24 monitors the address line 101 and the control line 103 and, when the CPU 11 requests a memory access or access to the internal register 26, the bus/address control circuit 24 informs the sequence control circuit 25 of this fact through a signal line 206. The bus/address control circuit 24 also controls the address line 101 and the control line 103 of the external bus of the CPU 11 in response to an instructing signal 205 from the sequence control circuit 25. Thus, the bus/address control circuit 24 in response to instructing signal 205 controls the access of the CPU 11 to the cache memory 15 and internal register 26. The bus/address control circuit also performs controlling operations to connect the data line 106 of the tag memory 14 to the address line 101 of the external bus of the CPU 11 in response to the instructing signal 205 from the sequence control circuit 25 at the times when the tag memory 14 is accessed and when the above described copyback operation mode is performed. The bus/address control circuit 24 also informs the sequence control circuit 25 of the contents of the data line 106 through the signal line 206.

The bus/address control circuit 24 also informs the sequence control circuit 25 of the contents of the data line 106 through the signal line 206.

The sequence control circuit 25 is a sequencer for controlling the processing steps of the cache memory controller 13. The sequence control circuit 25 is formed of a sequential logic circuit and a combinational logic circuit similar to that of known sequencers of cache memory controllers readily available on the market. The sequence control circuit 25, when the CPU 11 requests memory access or access to the internal register 26, is informed of this fact by the bus/address controlling circuit 24 through signal line 206. When the CPU 11 requests access to the internal register 26, the sequence control circuit causes the internal register 26 to be accessed, in response to the instructing signal 208, by the CPU 11 through the data line 12 of the external bus of the CPU 11.

Figure 4:
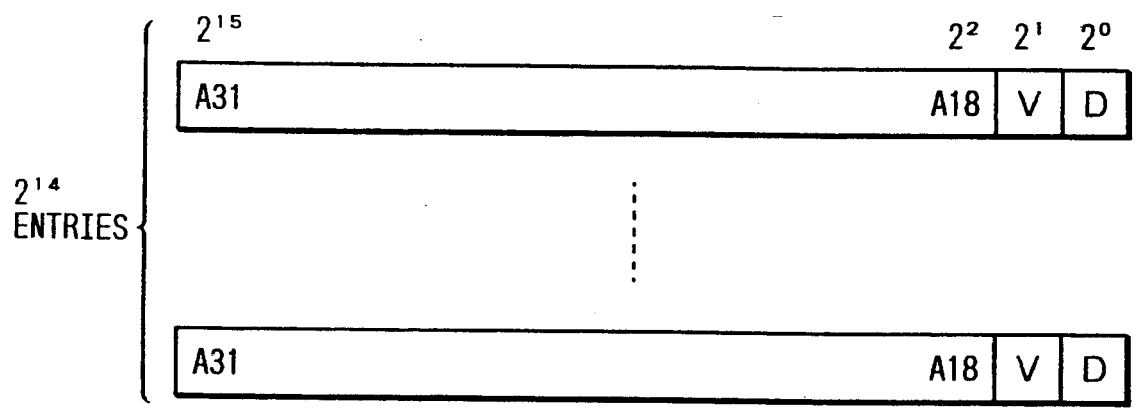
FIG. 4 illustrates an example of the structure of an entry of the tag memory shown in FIG. 1.

In FIG. 4 is shown an example of an entry structure of the tag memory 14. In this example it is assumed that the size of the address six, ace of the tag memory 14 is gigabytes ($2^{32}$), the size of one line of the cache memory is 16 bytes ($2^4$), the capacity of the cache memory is 256 kilobytes ($2^{18}$), and the number of ways of the cache memory is one way in a direct mapping system. In this case, the number of entries of the tag memory is equal to the number of lines of the cache memory, i.e., there are $2^{14}$ entries therein. In the present invention each entry is accessed using 14 bits, A17-A4 out of a 32-bit address A31-A0 of the address space. One entry is formed of 16-bits ($2^{15}$-$2^0$). In the 14 bits $2^{15}$-$2^2$ of the 16-bits $2^{15}$-$2^0$ of an entry, there are stored 14 bits of the address A31-A18 as the tag. The address A31-A18 corresponds to a line of the cache memory 15. The $2^1$ bit is called a "V" bit or valid bit, whose logical value 1 indicates that the entry is valid. The $2^0$ bit is called a "D" bit or dirty bit whose logical value 1 indicates that the contents of the cache memory and the contents of the main memory do not agree. The D bit is not restricted to one bit. It is possible to have the "D" bit represented by a plurality of bits, for example, 4 bits. In this case, 1 line having 16 bytes is considered as 4 words, each of the words including 4 bits, and each of the D bits indicates whether the contents of the cache memory of a respective word coincides with the contents of the main memory. The comparator function of the tag memory 14 acts on the 15 bits, $2^{15}$-$2^1$ stored in each entry of the tag memory corresponding to 14 bits A17-A4 of the address. If the contents of the 15 bits $2^{15}$-$2^1$ of an entry indicated as being valid by the $2^1$ bit agree with the 14 bits A31-A18 of the address at the time of the comparison access, then the comparison status line 105 is made active.

Figure 3:
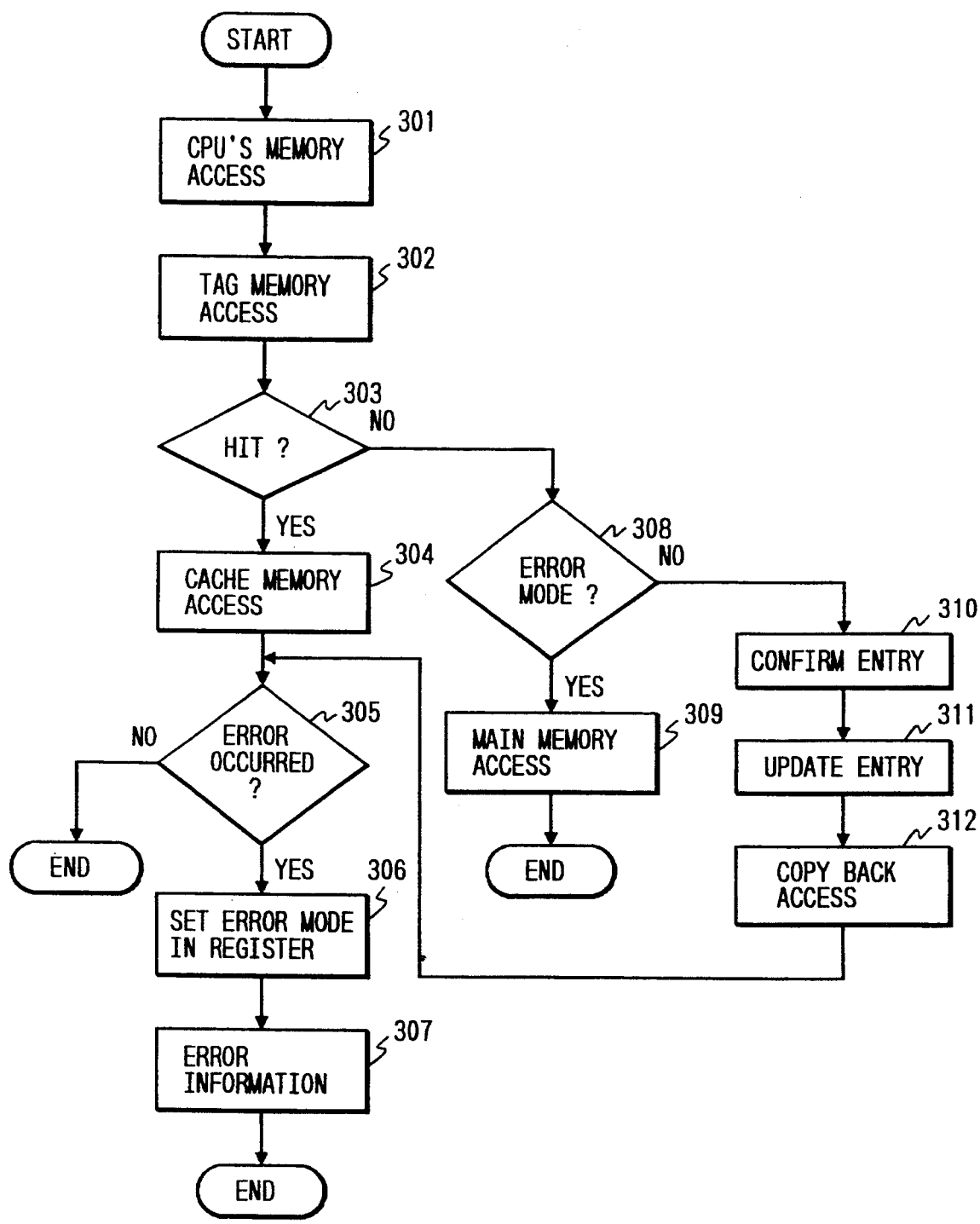
FIG. 3 is a flow chart of the processing steps of the cache memory controller shown in FIGS. 1 and 2.

When the CPU 11 requests memory access, the cache memory controller 13 operates through the steps of the flow chart shown in FIG. 3.

The operation of the cache memory controller 13 will be described below with reference to FIG. 3. When the CPU 11 requests memory access (step 301), the bus/address control circuit 24 informs the sequence control circuit 25 of the fact through the signal line 206. Upon receipt of the information through signal line 206, the sequence control circuit 25 outputs the instructing signals 201 and 205 to gain comparison access to the tag memory 14 (step 302). The seqence control circuit 25 monitors the comparison status line 105 of the tag memory 14 and decides whether the memory access hits the cache memory (step 303). When the memory access hits the cache memory 15, the sequence control circuit 25 outputs the instructing signal 202 to gain access to the cache memory 15 and also outputs the instructing signal 202 to respond to the access of the CPU 11 (step 304).

Further, the sequence control circuit 25 outputs the instructing signal 203A/203B to thereby decide whether a memory error has been produced in access to the tag memory 14 and the cache memory 15 (step 305). If no memory error has been produced the operation of the cache memory controller 13 is ended. When a memory error has been produced the error mode is set up in the internal register 26 through the signal line 204A/204B (step 306). In response thereto the sequence control circuit 25 outputs the instructing signal 205 so that the CPU 11 is informed of the memory error by an interrupt signal output to the control line 103 (step 307). The memory error detector 23A is provided for detecting errors in the cache memory 15 based on the error status line 108 of the cache memory 15 and the memory error detector 23B is provided for detecting an error in the tag memory 14 based on the error status line 110 of the tag memory 14. The memory error detector 23A is connected to the sequence control circuit 25 through an instructing signal line 203A through which the sequence control circuit 25 outputs the instructing signal 203A to decide whether an error has been produced in the access to the cache memory 15 and to a signal line 204A which provides an indication to the internal register 26 that an error has been produced in the cache memory 15. The memory error detector 23B is connected to the sequence control circuit 25 through instructing signal line 203B which provides the instructing signal 203B to cause the memory error detector 23B to decide whether a memory error has been produced in the access to the tag memory 14 and to signal line 204B which provides an indication to the internal register 26 that an error has been produced. The memory error detector 23A for detecting an error in the cache memory 15 may be a memory integrated circuit having a parity generator/checker for checking parity errors in the cache memory 15. The memory error detector 23B for detecting an error in the tag memory 14 may be a memory integrated circuit having a parity generator/checker for detecting a parity error in the tag memory or may be a logic circuit which detects illegal data in the tag memory 14 such as a tag entry in which the "V" (valid) bit is a logical value 0 or the "D" (dirty) bit is logical value 1.

In the tag memory access (step 302), access to the tag memory 14 is made with address bits A31-A0 using the 14 bits A17-A4 of the address A31-A0. Data is formed of the 14 bits of A31-A18 of the address A31-A0 and a "V" bit of logical value 1. The tag memory 14 compares the contents of the bits $2^{15}$-$2^1$ of the entry selected by the 14 bits A17-A4 of the address with the data formed of the 14 bits A31-A18 and makes the comparison status line 105 active only when they agree with each other. The memory access is decided to have hit the cache memory only when the comparison status line 105 is active.

When the memory access miss-hits in the decision step 303, the sequence control circuit 25 refers to the signal line 207 to decide whether the error mode is set up (step 308). When the error mode is set up, the sequence control circuit 25 starts up the main memory 12 through the start control line 109 to thereby cause the main memory 12 to take over the response to the memory access (step 309) and ends operation thereof. When the error mode is not set up the sequence control circuit 25, in updating the entry of the cache memory 15, performs the copyback operation characteristic of the copyback operation mode.

In performing the copyback operation the sequence control circuit 25 first gains read access to the tag memory 14 and confirms the data of the tag memory, i.e., the contents of the entry to be updated, through the signal line 206 (step 310). More specifically, the sequence control circuit 25 determines whether it is necessary to writeback (copyback) the data of the entry to be updated into the main memory according to the "V" bit and "D" bit corresponding to the entry. Then, the sequence control circuit 25 gains write access to the tag memory 14 and updates the entry corresponding to the contents of the memory access of the CPU 11 (step 311). Further, the sequence control circuit 25 performs a data transfer operation between the cache memory 15 and the main memory 12, i.e., copyback operation, according to the contents of the entry confirmed (step 312). Since the tag memory 14 and the cache memory 15 are accessed in the course of the copyback operation, it is possible that a memory error occurs in the tag memory 14 or the cache memory 15. Therefore, the sequence control circuit 25 returns to the decision step 305 and outputs the instructing signal 203A/203B to thereby decide whether a memory error has occurred during the access to the tag memory 14 and the cache memory 15 (step 305). If no memory error has occurred, the operation of the cache memory controller 13 is ended. If an error has occurred the error mode is set up in the internal register 26 through the signal line 204A/204B. Thereupon the sequence control circuit 25 outputs the instructing signal 205 to inform the CPU 11 of the occurrence of the error by outputting an interrupt signal to the control line 103 (step 307).

In the above-described confirm entry step 310, the 16 bits $2^{15}$-$2^0$ of an entry in the tag memory 14 are all read, and it is determined that the contents of the cache memory are valid and not in agreement with the contents of the main memory only when both the V bit and the D bit are logical a value 1 and during copyback operation (312), data transfer to the main memory is carried having bits A31-A18 of the address set to respective values of read bits $2^{15}$-$2^2$ from the entry. In the case that the dirty bit "D" is represented by a plurality of bits, for example, 4 bits, it could be decided that a word corresponding to the V bit indicating a logical value 1 does not coincide with the contents of the main memory. Thus, only the word is to be transferred to the main memory.

Through the above-described procedure, the cache memory controller 13 performs cache memory control in accordance with a normal copyback operation mode when no memory error has occurred. When a memory error has occurred, while the information of occurrence of the memory error is given to the CPU 11, the error mode is set up and the updating of the entry in the cache memory 15 is suspended. Further, with respect to valid entries existing at the time of occurrence of the error, the cache memory 15 is adapted to act as cache memory only when access from the CPU 11 hits the valid entries. Still further, after a memory error has occurred, the replacement of the contents of the cache memory 15 is inhibited but access to a valid entry is allowed. The error mode setting is adapted to be confirmed and cancelled by the CPU 11 by making the internal register 26 accessible by the CPU 11.

Figure 5:
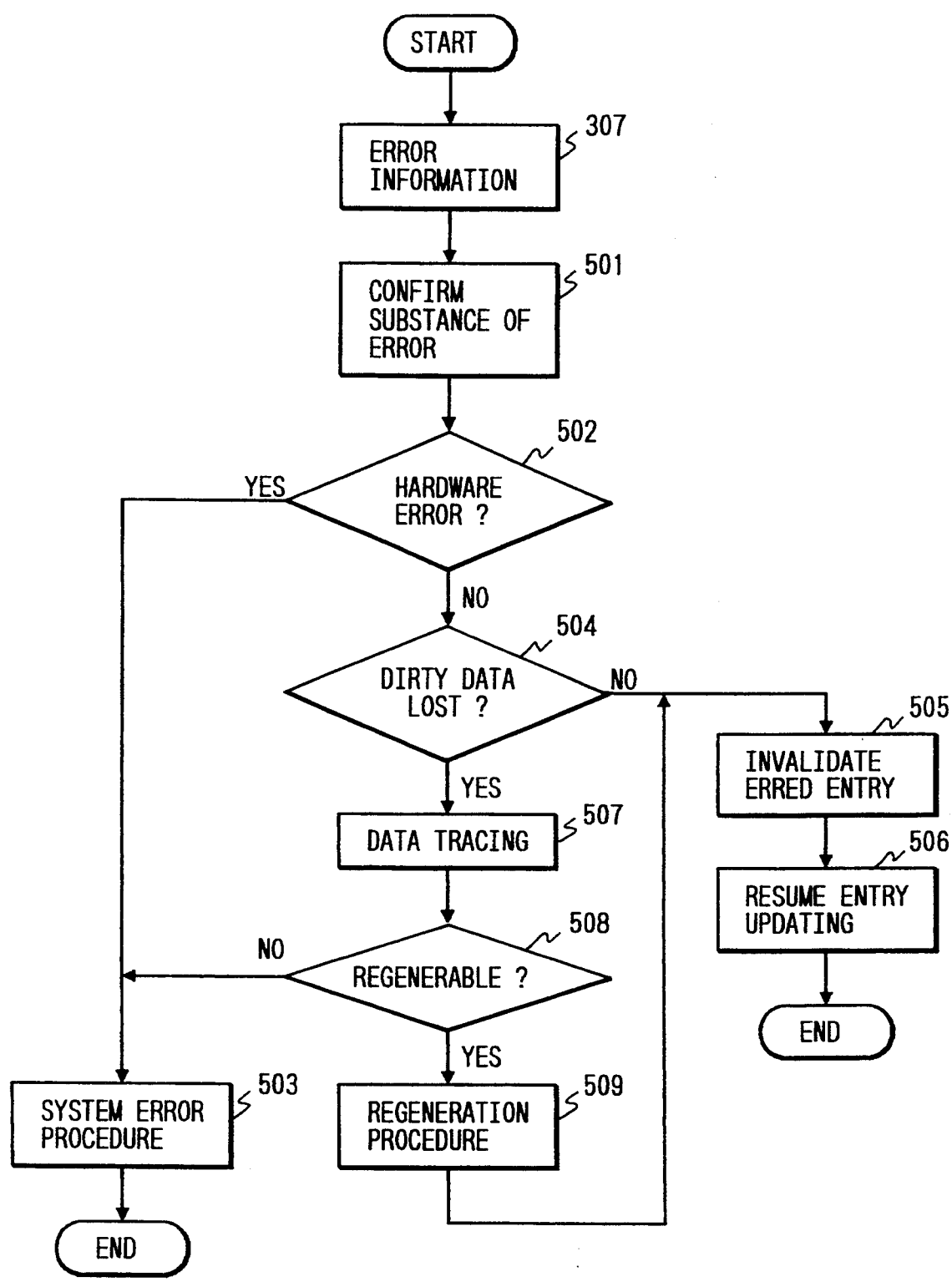
FIG. 5 is a flow chart of the processing steps performed by the central processing unit when an error is detected in the cache memory shown in FIG. 1.

A flow chart showing the processing steps performed by the CPU 11 when an error occurs is shown in FIG. 5. The CPU 11 includes apparatus for directly reading/writing from and to the tag memory 14 and the cache memory 15 at different addresses than that of the main memory. In other words, the CPU 11 includes apparatus for gaining I/O access to the tag memory 14 and the cache memory 15. The apparatus for gaining I/O access is provided in the following manner. When the bus/address control circuit 24 detects an address different from that of the main memory 12, the bus/address control circuit 24 gives information to initiate I/O access to the sequence control circuit 25, whereupon the sequence control circuit 25 gives instructions to the tag memory control circuit 21 or the cache memory control circuit 22 to read/write from/to the tag memory 14 or the cache memory 15 as requested. The apparatus for gaining I/O access is well known and is usually provided for a cache memory in a system operated in the write through operation mode.

The processing steps to be performed when an error occurs will be described below with reference to FIG. 5. When an error occurs in the tag memory 14 or the cache memory 15, the CPU 11 is informed of the occurrence of the error by the output of an interrupt signal or the like (step 307). The CPU 11 upon being informed of the occurrence of an error, confirms the substance of the error by an interrupt vector number or the like corresponding to the interrupt signal (step 501) to thereby determine what type of error occurred in the memory. Thereafter the CPU 11 makes a write/read test of the portion of the memory where the error occurred through I/O access to thereby decide whether the error is a hardware (hard) error due to damage of the memory or the like (step 502). When the CPU 11 determines that the error is a hard error ordinary system error procedure is followed regarding the error as an unrecoverable error (step 503). When the CPU 11 determines that the error is not a hard error, the CPU 11 reads the tag entry in the tag memory 14 related to the portion in the memory where the error occurred through I/O access to thereby decide whether data lost by the error is dirty data (i.e., the data is valid and is not in agreement with the contents of the main memory) by use of the logical value of the D bit (step 504). Since the lost data can be recovered from the main memory when the data is not dirty data, the related entry is invalidated by writing the logical value 0 into the "V" bit of the tag entry (step 505) and, then, the updating of the entry is resumed by writing into the internal register 26 to remove the error mode (step 506). Thereafter the system returns to normal operation. When the lost data is dirty data, the CPU 11 traces the data around the lost data (step 507) and decides whether the lost data can be regenerated (step 508). When the lost data is not regenerable, a well known ordinary system error procedure (step 503) is followed. When the data is regenerable, a regeneration procedure (step 509), such as restoration of the status immediately before the generation of the lost data, is performed, and then the related entry is invalidated (step 505). The updating of the entry is resumed (step 506) and, then, the CPU 11 returns to its normal operation.

In the data tracing step 507 and the regeneration processing step 509, the CPU 11 initiates memory access. In the cache memory system operating in the copyback operation mode, it is a prerequisite condition that the cache memory 15 is accessed as to valid entries and the main memory is accessed as to other entries. Further, until the error recovery process by the CPU 11 is finished, the status at the time of occurrence of the error must be kept in the same as much as possible. Still further, the updating of the entry is suspended when an error occurs in the present invention, and, as to the valid entry existing at the time the error occurred, the cache memory 15 is adapted to be accessed only when memory access hits the valid entries. Thus, the above-mentioned prerequisite condition is satisfied and the CPU 11 is allowed to easily perform error recovery processing.

Figure 6:
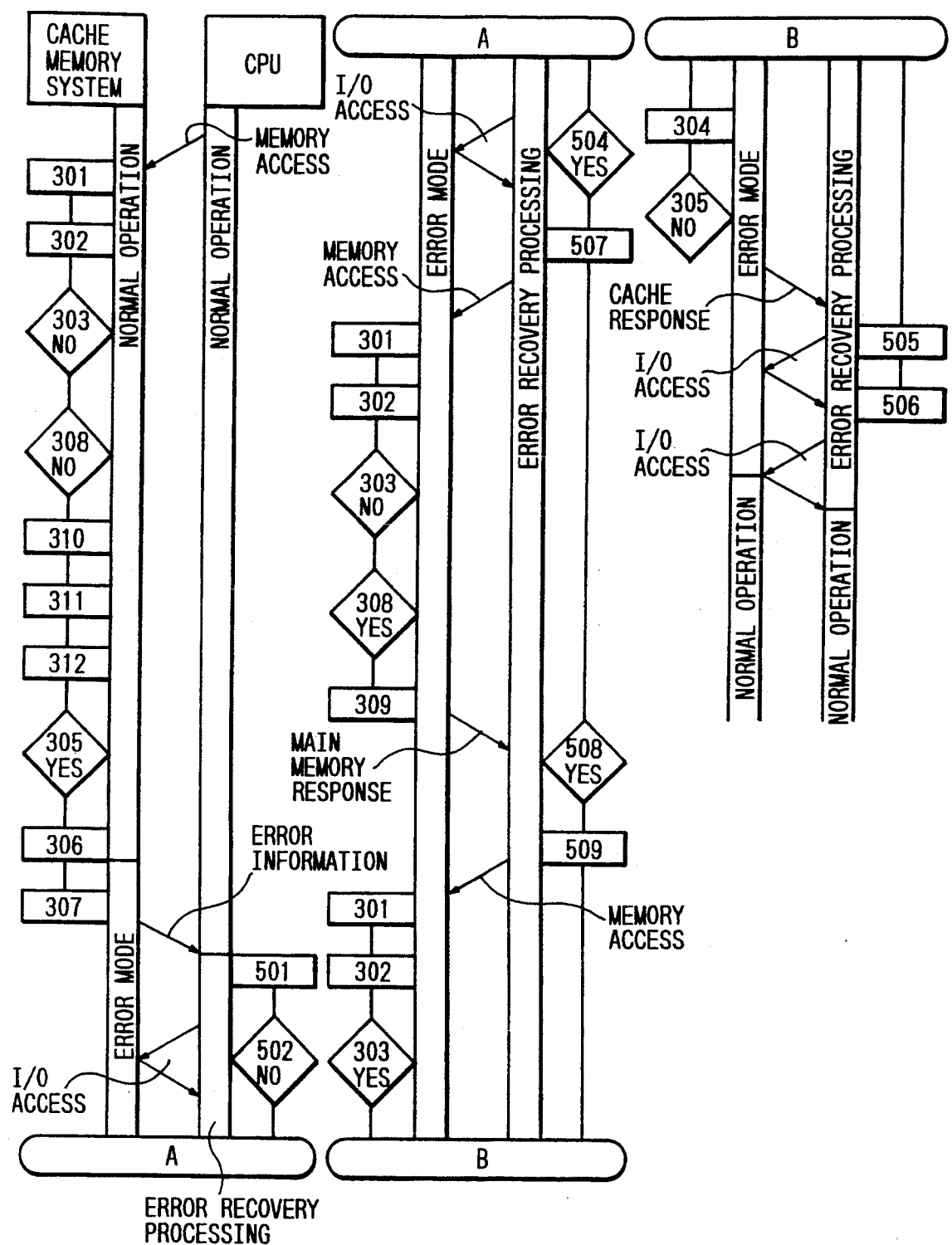
FIG. 6 is a diagram of the operation sequence of the central processing unit and the cache memory system of the present invent:ion during error recovery processing.

FIG. 6 illustrates a diagram of the operation sequence of the CPU 11 and the cache memory system 10 during the time of error recovery processing. The reference numbers used in FIG. 6 indicate operations performed by the CPU 11 and the cache memory system 10 based on the steps as shown in FIGS. 3 and 5 and as described above.

While both the CPU 11 and the cache memory system 10 are performing normal operations, the CPU 11 initiates memory access. Then, the cache memory system 10 performs operations through the processing steps of FIG. 3 from the step 301 downward. In this example the tag memory access step 302 does not hit the cache memory 15 step 303 (no) and no error mode is set up step 308 (no). Hence, after confirming the entry contents step 310, and updating the entry step 311, a copyback access is gained step 312. In the course of the copyback access an error occurs step 305 (yes) and then, the cache memory system 10 is brought into the set error mode step 306 and responds to the CPU 11 with error information step 307.

Upon receipt of the error information the CPU 11 performs error recovery processing through the steps of FIG. 5 beginning with step 501. If the error is not a hard error, step 502 (no), but an error of the dirty data, step 504 (yes), the CPU 11 performs data tracing step 507. At this time memory access may be performed several times but only one memory access is shown in FIG. 6. Upon receipt of the request for memory access the cache memory system 10 performs the operations in the steps of FIG. 3 from the step 301 downward. After the cache miss-hits step 303 (no), since the error mode is set up step 308 (yes), the main memory is accessed step 309, and the response is provided to the CPU 11.

If the CPU 11 decides the lost data to be regenerable step 508 (yes), regenerating processing step 509 is performed. Again, although memory access can be performed several times only one time is shown in this example. Upon receipt of the request for memory access the cache memory system 10 performs the operations in the steps of FIG. 3 from step 301 downward. Since, after the cache hit step 303 (yes), the procedure is normally ended step 304, when an error has not occurred step 305 (no), the cache memory system 10 provides the response to the CPU 11. After the regeneration processing has been ended, the CPU 11 invalidates the entry step 505 and resumes the entry updating step 506, and thus the CPU 11 and the cache memory system 10 return to their normal operations.

While the present invention has been described in terms of its preferred embodiment, it should be understood that numerous modifications may be made thereto without departing from the spirit and scope of the invention as defined in the appended claims. For example, the present invention may be used in any application having a cache memory system operated in the copyback operation mode. It is intended that all such modifications fall within the scope of the appended claims.

We claim:

1. A cache memory system connected to a central processing unit and a main memory, wherein said cache memory system is controlled to operate in a copyback operation mode, said system comprising:
   a cache memory for operating as cache memory to said central processing unit; and
   control means, coupled to said cache memory and responsive to detection of an error in said cache memory by error detection means, for suspending an updating operation of an entry in said cache memory in which said error was detected, controlling access to valid entries in said cache memory, and controlling said cache memory to operate as cache memory only when access from said central processing unit hits said valid entries of said cache memory.

2. A cache memory system connected to a central processing unit and main memory, wherein said cache memory system is controlled to operate in a copyback operation mode, said system comprising:
   a cache memory for operating as cache memory to said central processing unit;
   error detection means for detecting an error when said cache memory is accessed; and
   control means coupled to said cache memory and said error detection means, for suspending, after an error is detected by said error detection means, an updating operation of an entry in said cache memory in which said error is detected, controlling valid entries of said cache memory existing when said error is detected and controlling said cache memory to operate as cache memory only when access from said central processing unit hits said valid entries of said cache memory.

3. A cache memory system according to claim 1 wherein said control means comprises:
   means for resuming said suspended updating operation of the entry in said cache memory in response to instructions from said central processing unit after said error in said cache memory has been corrected.

4. A cache memory system according to claim 2 wherein said control means comprises:
   means for resuming said suspended updating operation of the entry in said cache memory in response to instructions from said central processing unit after said error in said cache memory has been corrected.

5. A cache memory system connected to a central processing unit and a main memory wherein said cache memory system is controlled to operate in a copyback operation mode, said system comprising:
   a cache memory for operating as a cache memory to said central processing unit; and
   control means, coupled to said cache memory, for allowing, after an error in said cache memory is detected by error detection means where said cache memory is accessed, access from said central processing unit to valid entries of said cache memory existing at the time of occurrence of said error when the access hits a valid entry in said cache memory, inhibiting access from said central processing unit to said cache memory when the access miss-hits an entry in said cache memory and allowing said central processing unit to access said main memory without replacing the contents of said cache memory when the access miss-hits an entry in said cache memory.

6. A cache memory controller for controlling, under control of a central processing unit, a cache memory for storing a copy of a portion of contents of a main memory and a tag memory for storing address information of the copy stored in said cache memory, comprising:
- tag memory control means for controlling read and write operations of said tag memory;
- cache memory control means for controlling read and write operations of said cache memory;
- error detecting means, coupled to said cache memory and said tag memory, for detecting an error in said cache memory and said tag memory;
- error retaining means, coupled to said error detecting means, for retaining, when an error is detected by said error detecting means, error information indicating occurrence of the error; and
- sequence control means, coupled to said tag memory control means, said cache memory control means said error retaining means for controlling, under the control of said central processing unit, operations of said tag memory control means and said cache memory control means according to said error information retained in said error retaining means.

7. A cache memory controller according to claim 6, wherein said sequence control means inhibits write operations of new address information into said tag memory when error information indicating occurrence of an error is retained in said error retaining means and allows read and write operations of said cache memory when access from said central processing unit hits address information stored in said tag memory corresponding to valid entries in said cache memory.

8. A cache memory controller according to claim 6 wherein said sequence control comprises:
- means for allowing said central processing unit to alter said error information retained in said error retaining means.

9. A cache memory controller according to claim 7 wherein said sequences control means comprises:
- means for allowing said central processing unit to alter said error information retained in said error retaining means; and
- means for resuming said inhibited write operations after said error in said cache memory has been corrected.

10. A method of controlling a cache memory connected to a central processing unit and a main memory comprising the steps of:
- outputting said cache memory in a copyback operation mode as cache memory to said central processing unit;
- in response to detection of an error in said cache memory, suspending an updating operation of an entry in said cache memory in which said error was detected;
- controlling access to valid entries in said cache memory; and
- causing said cache memory to operate as cache memory only when access from said central processing unit hits said valid entries of said cache memory.

11. A method of controlling a cache memory connected to a central processing unit and main memory comprising the steps of:
- operating said cache memory in a copyback operation mode as cache memory to said central processing unit;
- detecting an error when said cache memory is accessed;
- suspending, after an error is detected by said error detecting step, an updating operation of an entry in said cache memory in which said error was detected;
- updating an entry in said cache memory in which said error is detected;
- controlling valid entries of said cache memory existing when said error is detected; and
- causing said cache memory to operate as cache memory only when access from said central processing unit hits said valid entries of said cache memory.

12. A method of controlling a cache memory according to claim 10 further comprising the steps of:
- resuming said suspended updating operation of the entry in said cache memory in response to instructions from said central processing unit after said error in said cache memory has been corrected.

13. A method of controlling a cache memory according to claim 11 further comprising the steps of:
- resuming said suspended updating operation of the entry in said cache memory in response to instructions from said central processing unit after said error in said cache memory has been corrected.

14. A method of controlling a cache memory connected to a central processing unit and a main memory comprising the steps of:
- operating said cache memory in a copyback operation mode as cache memory to said central processing unit;
- allowing, after an error in said cache memory is detected when said cache memory is accessed, access from said central processing unit to valid entries of said cache memory existing at the time of occurrence of said error when the access hits a valid entry in said cache memory;
- inhibiting access from said central processing unit to said cache memory when the access miss-hits an entry in said cache memory; and
- allowing said central processing unit to have said main memory accessed without replacing the contents of said cache memory when the access miss-hits an entry in said cache memory.

15. A method of controlling by a central processing unit, a cache memory, operated in the copyback operation mode, for storing a copy of a portion of contents of a main memory and a tag memory for storing address information of the copy stored in said cache memory, said method comprising the steps of:
- controlling read and write operations of said tag memory;
- controlling read and write operations of said cache memory;
- detecting an error in said cache memory and said tag memory;
- retaining, when an error is detected by said error detecting means, error information indicating occurrence of the error; and
- controlling, under the control of said central processing unit, operations of said tag memory control means and said cache memory control means according to said retained error information.

16. A method of controlling a cache memory according to claim 15 wherein said controlling step comprises the step of:
- inhibiting write operations of new address information into said tag memory when error information indicating occurrence of an error is retained by said retaining step; and allowing read and write operations of said cache memory when access from said central processing unit hits address information stored in said tag memory corresponding to valid entries in said cache memory.

17. A method of controlling a cache memory according to claim 15 further comprising the steps of:

allowing said central processing unit to alter said error information retained by said retaining step.

18. A method of controlling a cache memory according to claim 16 further comprising the steps of:

allowing said central processing unit to alter said error information retained by said retaining step in said error; and resuming said inhibited write operations after said error in said cache memory has been corrected.

* * * * *